US007164303B2

(12) United States Patent
Watanabe

(10) Patent No.: US 7,164,303 B2
(45) Date of Patent: Jan. 16, 2007

(54) DELAY CIRCUIT, FERROELECTRIC MEMORY DEVICE AND ELECTRONIC EQUIPMENT

(75) Inventor: Kenya Watanabe, Suwa (JP)

(73) Assignee: Seiko Epson Corporation (JP)

( * ) Notice: Subject to any disclaimer, the term of this patent is extended or adjusted under 35 U.S.C. 154(b) by 2 days.

(21) Appl. No.: 10/997,820

(22) Filed: Nov. 24, 2004

(65) Prior Publication Data

US 2005/0128859 A1 Jun. 16, 2005

(30) Foreign Application Priority Data

Nov. 25, 2003 (JP) ............................. 2003-394476

(51) Int. Cl.
*H03H 11/26* (2006.01)
(52) U.S. Cl. ...................... 327/261; 327/264
(58) Field of Classification Search ........ 327/261–264, 327/268, 272, 278, 283, 285, 290, 530, 534, 327/535
See application file for complete search history.

(56) References Cited

U.S. PATENT DOCUMENTS

| 6,275,425 B1 * | 8/2001 | Eliason ................. 365/189.11 |
| 6,522,569 B1 | 2/2003 | Miyakawa et al. ......... 365/145 |
| 6,573,543 B1 | 6/2003 | Takata ....................... 257/295 |
| 6,876,568 B1 * | 4/2005 | Ueda et al. ................. 365/145 |

FOREIGN PATENT DOCUMENTS

| JP | 06-119773 | 4/1994 |
| JP | 06-259957 | 9/1994 |
| JP | 09-259590 | 10/1997 |
| JP | 2002-109883 | 4/2002 |
| JP | 2002-170382 | 6/2002 |
| JP | 2003-059260 | 2/2003 |
| JP | 2005-158128 | 6/2005 |

* cited by examiner

*Primary Examiner*—Linh My Nguyen
(74) *Attorney, Agent, or Firm*—Harness, Dickey & Pierce, P.L.C.

(57) ABSTRACT

A delay circuit generates an output signal by delaying an input signal, and includes a ferroelectric capacitor having a first end and a second end, a means for inverting a polarization of the ferroelectric capacitor by producing an electric potential difference between the first end and the second end based on an electric potential of the input signal and a generation means for generating the output signal by delaying the input signal based on a change in an electric potential of the second end caused by the polarization inversion.

7 Claims, 3 Drawing Sheets

DELAY CIRCUIT, FERROELECTRIC MEMORY DEVICE AND ELECTRONIC EQUIPMENT

RELATED APPLICATIONS

This application claims priority to Japanese Patent Application No. 2003-394476 filed Nov. 25, 2003 which is hereby expressly incorporated by reference herein in its entirety.

BACKGROUND

1. Field of the Invention

The present invention relates to a delay circuit that includes a ferroelectric capacitor.

2. Related Art

A conventional delay circuit is disclosed in Japanese Unexamined Patent Publication No. 9-259590. The conventional delay circuit delays a signal by having a ferroelectric capacitor as a capacitance coupled to a propagation path of the signal However, in the conventional delay circuit, there is a problem in that the delay circuits have wide variation in their delay times due to variations in their manufacturing process. For example, the delay time is defined as the time it takes an electric potential of a path to which the capacitor is coupled to exceed a threshold voltage of a transistor in the next circuit coupled to the path. The threshold voltage of transistors widely varies depending on variations in the manufacturing process. Accordingly, the delay circuits have a wide variation in delay times.

Furthermore, when the conventional delay circuit is applied to a ferroelectric memory device and the like, there is a problem in that a malfunction could occur since its operation timing could be off due to the variation in the delay time.

The present invention has been developed in consideration of the above-mentioned problem, and intended to provide a delay circuit that can solve the above-mentioned problems, a ferroelectric memory device and electronic equipment.

SUMMARY

In order to accomplish the above, a delay circuit of the present invention generates an output signal by delaying an input signal, and includes a ferroelectric capacitor having a first end and a second end, a means for inverting a polarization of the ferroelectric capacitor by producing an electric potential difference between the first end and the second end based on an electric potential of the input signal and a generation means for generating the output signal by delaying the input signal based on a change in an electric potential of the second end caused by the polarization inversion.

In such a delay circuit, the input signal is delayed according to the time until the electric potential difference between the first end and the second end of the ferroelectric capacitor exceeds an electric potential difference at which the polarization of the ferroelectric capacitor is inverted. In other words, when the electric potential difference at which the polarization of the ferroelectric capacitor is inverted is given between the first end and the second end of the ferroelectric capacitor, an electric charge is produced by the polarization inversion. Then, a voltage which exceeds a threshold voltage of the next logical circuit for example, is generated at the second end of the ferroelectric capacitor by the electric charge. The electric charge is produced when a predetermined period is passed (expires) since an electric potential of the input signal changed. This can delay the input signal for the predetermined period.

Here, the delay time of the input signal depends on a polarization inversion characteristic of a ferroelectric material that forms the ferroelectric capacitor. Therefore, in this way, even if a variation of the threshold voltage occurs by variations in the manufacturing process, a delay circuit having a stable delay time can be provided because the delay time is set without being affected by the variation.

In addition, in this way, the delay time can be set longer even when the ferroelectric capacitor has a small area because the delay time is set based on the polarization inversion of the ferroelectric capacitor. Therefore, a delay circuit of a small size can be provided. Furthermore, a delay circuit with less consumption current can also be provided.

In the delay circuit, a capacitance formed to be electrically connectable to the second end of the ferroelectric capacitor may be included. In this way, the delay time can be sensitively controlled because in addition to the ferroelectric capacitor, the capacitance can also control the delay time.

In the delay circuit, a switch means for switching the capacitance between being coupled and uncoupled relative to the second end of the ferroelectric capacitor based on the electric potential of the input signal may be included. In this way, the capacitance coupled to the second end of the ferroelectric capacitor can be changeable. Therefore, when the polarization of the ferroelectric capacitor is inverted or data written in the ferroelectric capacitor is read out, electric charges stored in the ferroelectric capacitor are efficiently swept out. Furthermore, when the polarization of the ferroelectric capacitor is inverted again or the data is rewritten in the ferroelectric capacitor, a time for inverting the polarization can be shorten.

In the delay circuit, a means for discharging the capacitance may be included in a case where the switch means does not electrically couple the capacitance to the second end of the ferroelectric capacitor. In this way, an initiation action (reset action) for operating the delay again after the delay circuit performs a predetermined delay operation can be sped up because the capacitance is discharged while the capacitance is electrically separated from the second end of the ferroelectric capacitor.

In the delay circuit, a voltage source generating a predetermined voltage and a resistance provided between the first end of the ferroelectric capacitor and the voltage source may be included. In this case, a means for switching the first end of the ferroelectric capacitor between being electrically coupled to the voltage source through the resistance and being grounded is preferably included. Also, it is preferable that the resistance is formed such that its resistance value is adjustable.

In this way, the time when the polarization of the ferroelectric capacitor is inverted changes depending on the resistance value of the resistance. Therefore, the delay time of the input signal can be controlled by controlling the resistance value of the resistance. A way of adjusting the resistance value is, for example, laser trimming, a program circuit using the ferroelectric capacitor, using a nonvolatile memory such as a flash memory and the like. The delay circuit may have a constant current circuit that includes MOS transistors instead of the resistance.

In the delay circuit, a means for generating a delay signal by delaying the input signal and means for inverting the polarization of the ferroelectric capacitor again by controlling the electric potential of the second end of the ferroelectric capacitor based on an electric potential of the delay signal may be included.

In this way, a complicated circuit is not needed for inverting the polarization of the ferroelectric capacitor again or rewriting data that is read out from the ferroelectric capacitor. Therefore, a configuration of the delay circuit can be simplified.

A semiconductor device of the present invention includes the above-described delay circuit. Here, the semiconductor device refers to a general device that has a semiconductor and the above-described delay circuit. A structure of the semiconductor device is not particularly limited. For example, a ferroelectric memory device including the delay circuit and any device that delays a signal such as a dynamic random access memory (DRAM) and a flash memory can be named as such semiconductor device.

An electronic equipment of the present invention includes the above-described semiconductor device. Here the electronic equipment refers to general equipment having the above-described semiconductor device and carrying out some function. A structure of the electronic equipment is not particularly limited. For example, general computers that have the above-described semiconductor device, a cellular phone, a personal handyphone system (PHS), a personal digital assistant (PDA), an electronic notebook, an IC card and the like, as well as any device that has a RAM or a read only memory (ROM) can be named as such electronic equipment.

DETAILED DESCRIPTION

The present invention will now be described through embodiments with reference to the accompanying drawings. Embodiments described below shall not limit the invention which is described in claims. Also, all combinations of the features described in the embodiments are not necessarily essential to the invention.

Figure 1:
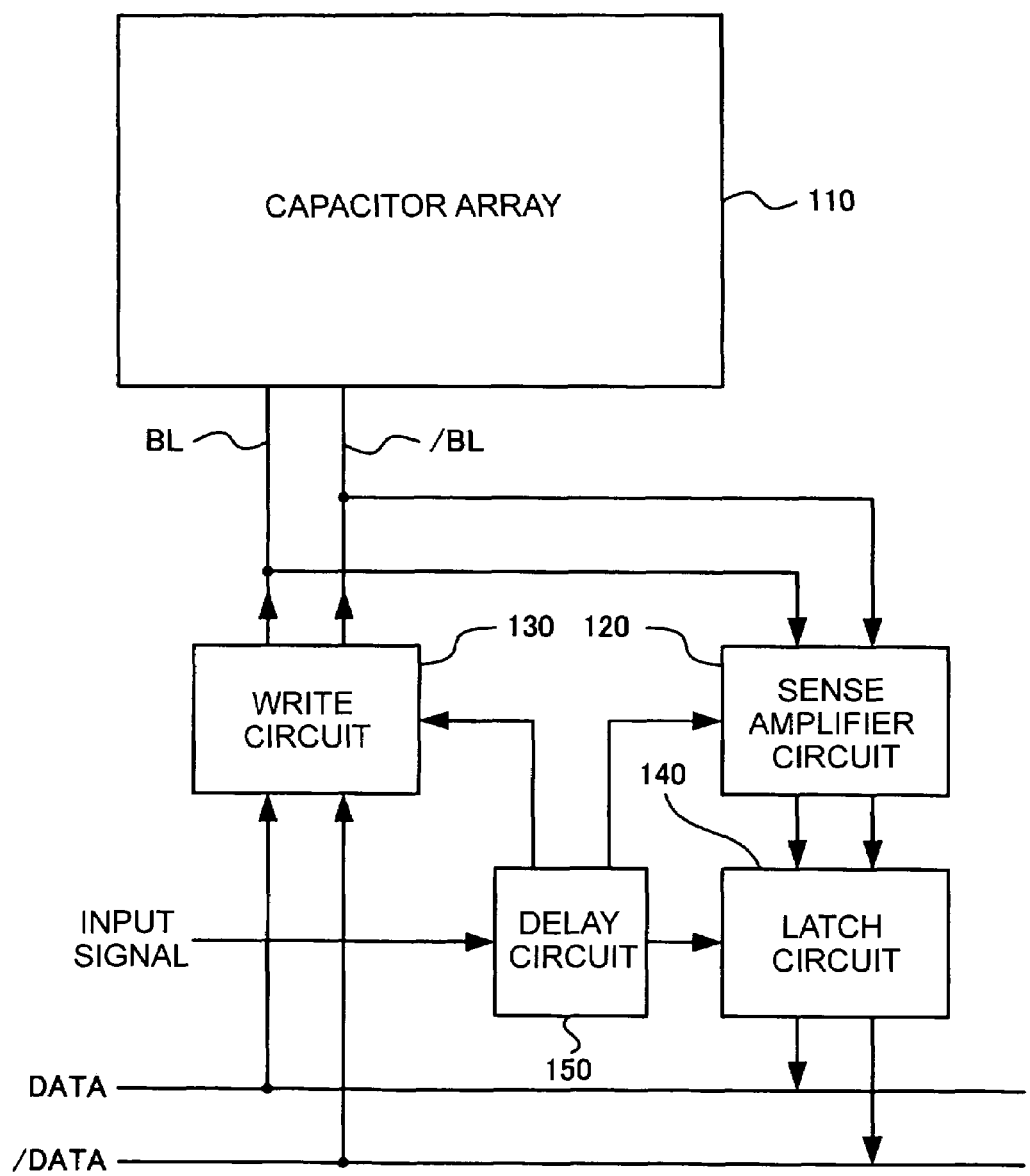
FIG. 1 is a functional block diagram showing a ferroelectric memory device 100 according to an embodiment of the present invention.

FIG. 1 is a functional block diagram showing a ferroelectric memory device 100 according to an embodiment of the present invention. The ferroelectric memory device 100 includes a capacitor array 110, a sense amplifier circuit 120, a write circuit 130, a latch circuit 140 and a delay circuit 150. The capacitor array 110 has a plurality of ferroelectric capacitors provided in array.

The sense amplifier circuit 120 determines data written into the ferroelectric capacitor based on an electric potential of a first bit line BL and/or a second bit line/BL that are complementary. The sense amplifier circuit 120 is preferably a current mirror type or current detector type sense amplifier circuit. The write circuit 130 writes a specific data into the ferroelectric capacitor based on data received from a first data line DATA and a second data line/DATA that are complementary. The latch circuit 140 latches an output data of the sense amplifier circuit 120 and outputs it to the first data line DATA and the second data line/DATA.

The delay circuit 150 receives an input signal as input and generates an output signal by delaying the input signal for a predetermined period. The delay circuit 150 supplies the output signal to the sense amplifier circuit 120, the write circuit 130 and the latch circuit 140. To be more specific, the delay circuit 150 supplies the output signal as a sense amplifier enable signal that controls a drive of the sense amplifier circuit 120 to the sense amplifier circuit 120.

The sense amplifier circuit 120 starts and/or finishes a determination on the data written in the ferroelectric capacitor based on a change in a logical value of the sense amplifier enable signal. This means that the delay circuit having the ferroelectric capacitor controls an operation timing of the sense amplifier circuit. Accordingly, the operation timing can be set according to the characteristic of the ferroelectric capacitor. Therefore, electric power consumption of the sense amplifier circuit can be reduced. In addition, the noise of the power source can be reduced.

The delay circuit 150 supplies the output signal as a write enable signal that controls an operation timing of the write circuit 130 to the write circuit 130. The write circuit 130 starts writing data into the ferroelectric capacitor based on a change in a logical value of the write enable signal.

The delay circuit 150 also supplies the output signal as a data latch signal that controls an operation timing of the latch circuit 140 to the latch circuit 140. The latch circuit 140 latches the output data which is outputted from the sense amplifier circuit 120 based on a change in a logical value of the data latch signal.

In this embodiment, the operation of the sense amplifier circuit 120, the write circuit 130 and the latch circuit 140 is controlled based on the output signal from the delay circuit 150. However, besides the output signal from the delay circuit 150, the operation of the sense amplifier circuit 120, the write circuit 130 and the latch circuit 140 may be controlled based on a respective control signal. More particularly, the sense amplifier circuit 120 may receive the control signal that controls the operation of the sense amplifier circuit and may determine the data written into the ferroelectric capacitor based on the control signal. The write circuit 130 may receives the control signal that controls the operation of the write circuit 130 and may write the data in the ferroelectric capacitor based on the control signal. The latch circuit 140 may receive the control signal that controls the operation of the latch circuit 140 and may be controlled as to whether it latches the output data of the sense amplifier circuit 120 or not based on the control signal.

Figure 2:
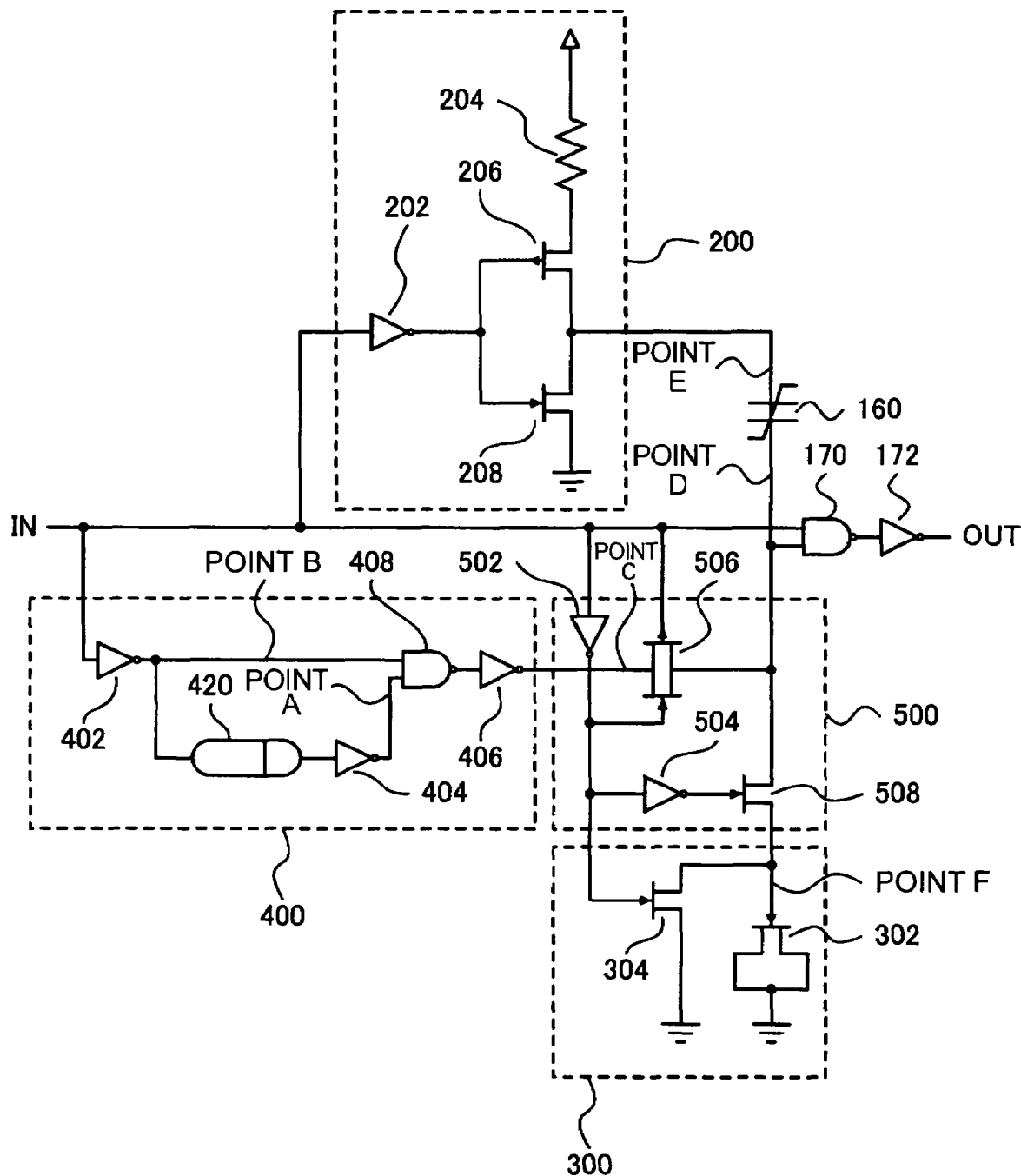
FIG. 2 is a circuit diagram showing an example of a delay circuit 150.

FIG. 2 is a circuit diagram showing an example of the delay circuit 150. The delay circuit 150 includes a ferroelectric capacitor 160, a first potential control member 200 that controls an electric potential at one end (a point e) of the ferroelectric capacitor 160, a second potential control member 300 and a third potential control member 400 that control an electric potential at the other end (a point d) of the ferroelectric capacitor 160. The delay circuit 150 also includes a switching member 500 that switches between the second potential control member 300 and the third potential control member 400 to control the potential at the other end of the ferroelectric capacitor 160 and a NAND circuit 170 which is an example of a means of producing the output signal.

The first potential control member 200 controls the electric potential at the one end of the ferroelectric capacitor 160 based on an electric potential of an input signal IN. In this embodiment, the input signal IN is a digital signal that indicates a logical "H" when the potential of the input signal IN is higher than a predetermined potential, and indicates a logical "L" when the potential is lower than the predetermined potential. In the embodiments described below, the logical L means that the signal potential is 0 V, and the logical H means that the signal potential is VCC, which is a drive voltage of the delay circuit 150.

The first potential control member 200 includes an inverter 202, a resistive element 204 which is an example of resistance, a p-type metal oxide semiconductor (MOS) transistor 206 and an n-type MOS transistor 208. The inverter 202 receives the input signal IN and inverts a logical value of the input signal IN. Then, the inverted input signal is supplied to gates of the p-type MOS transistor 206 and the n-type MOS transistor 208. The resistive element 204 is provided between a voltage supply that generates a predetermined voltage and the p-type MOS transistor 206. In other words, the resistive element 204 steps down the predetermined voltage and supplies it to a source or a drain of the p-type MOS transistor 206.

The source or the drain of the p-type MOS transistor 206 is electrically coupled to a source or a drain of the n-type MOS transistor 208. The source or the drain of the n-type MOS transistor 208 is grounded. The p-type MOS transistor 206 and the n-type MOS transistor 208 controls the potential at the one end of the ferroelectric capacitor 160 based on the logical value (electric potential) of the signal that is supplied to the gates of these transistor.

The second potential control member 300 and the third potential control member 400 controls the electric potential at the other end of the ferroelectric capacitor 160 based on the potential of the input signal IN. The first potential control member 200, the second potential control member 300 and the third potential control member 400 control a polarization state of the ferroelectric capacitor 160 by controlling the electric potential at the one end and the other end of the ferroelectric capacitor 160 based on the potential of the input signal IN. This can improve the reliability of the ferroelectric capacitor.

More particularly, the second potential control member 300 controls the electric potential at the other end of the ferroelectric capacitor 160 based on the potential of the input signal IN so as to invert the polarization of the ferroelectric capacitor 160. The third potential control member 400 controls the electric potential at the other end of the ferroelectric capacitor 160 so as to invert the polarization of the ferroelectric capacitor 160 again. In other words, the third potential control member 400 controls the electric potential so as to return the polarization state of the ferroelectric capacitor 160 to a state before the second potential control member 300 inverts the polarization. Next, a structure of the second potential control member 300 and the third potential control member 400 will be described below.

The second potential control member 300 includes an n-type MOS transistor 302 and an n-type MOS transistor 304. The n-type MOS transistor 302 is an example of capacitance whose one end is a gate of the n-type MOS transistor 302 and the other end is a source and a drain of the n-type MOS transistor 302. In other words, the source and the drain are short-circuited and grounded, and the gate is formed so as to be electrically connectable to the other end of the ferroelectric capacitor 160 through the switching member 500. The n-type MOS transistor 302 stores an electric charge based on an electric potential of the gate. Instead of the n-type MOS transistor 302, a p-type MOS transistor may be used to couple the source or drain to the voltage supply. In this case, an electric potential at the point "d" and a point "f" is raised from 0 V (ground potential) of the point f by electric charges taken out from the ferroelectric capacitor 160, and a channel is formed in the p-type MOS transistor until the electric potential reaches VCC–Vthp. Therefore, a characteristic of a paraelectric material can be utilized more as compared to a case in which the n-type MOS transistor is used. Consequently, the delay circuit in which the p-type MOS transistor is used has an advantage in that the delay time will be less affected by variations in the manufacturing process.

Either a source or a drain of the n-type MOS transistor 304 is electrically coupled to the gate of the n-type MOS transistor 302 and the other source or drain is grounded. A gate of the n-type MOS transistor 304 is electrically coupled to the switching member 500 and switches between conduction and no conduction depending on the potential of the input signal IN. In other words, the n-type MOS transistor 304 switches the gate of the n-type MOS transistor 302 between being grounded or not depending on the potential of the input signal IN.

The third potential control member 400 controls the electric potential at the other end of the ferroelectric capacitor 160 by generating a delay signal which is the delayed input signal IN. Here, the delay signal includes a signal generated by delaying the whole input signal IN, a signal generated by delaying at least one edge of the input signal IN and signals generated by shaping these signals.

The third potential control member 400 includes inverters 402, 404 and 406, a NAND circuit 408 and a delay unit 420. The inverter 402 generates an inverting input signal that is the input signal IN whose logical value is inverted, and the inverter 402 supplies it to the NAND circuit 408 and the delay unit 420. The delay unit 420 delays the inverting input signal for a predetermined period. The delay unit 420 is, for example, a delay circuit in which a delay element such as a buffer is cascaded in a signal path in which the inverting input signal propagates, a delay circuit in which capacitance is coupled to the signal path and another delay circuit. The delay unit 420 may be the delay circuit 150 according to this embodiment.

The inverter 404 generates a signal in which the inverting input signal delayed by the delay unit 420 is further inverted. Then, the NAND circuit 408 performs logical negative multiply between the signal and the inverting input signal and supplies the multiplied signal to the inverter 406. The inverter 406 inverts the signal and supplies the inverted signal as the delay signal to the switching member 500. In other words, in this embodiment, the third potential control member 400 performs an AND operation to the inverting input signal and the delayed input signal. Then the third potential control member 400 supplies the operated signal as the delay signal to the switching member 500.

The switching member 500 switches between the second potential control member 300 and the third potential control member 400 to control the electric potential at the other end of the ferroelectric capacitor 160 based on the potential of the input signal IN. In this embodiment, the switching member 500 controls the electric potential of the other end by switching the other end of the ferroelectric capacitor 160 to electrically couple to either the gate of the n-type MOS transistor 302 which is one of the examples of capacitance or an output of the third potential control member 400 depending on the potential of the input signal IN.

The switching member 500 includes inverters 502 and 504, a transmission gate 506 and an n-type MOS transistor 508. The inverter 502 inverts the logical value of the input signal IN and outputs it as an inverting input signal to a gate of an n-type MOS transistor that forms the transmission gate 506, the inverter 504 and the gate of the n-type MOS transistor 304.

The transmission gate 506 includes an n-type MOS transistor and a p-type MOS transistor whose sources and drains are electrically coupled to each other. Either the source or the drain of the transmission gate 506 is electrically coupled to the output of the third potential control member 400. The other one of the source or the drain is electrically coupled to the other end of the ferroelectric capacitor 160. The inverting input signal generated by the inverter 502 is supplied to the gate of the n-type MOS transistor, and the input signal IN is supplied to the gate of the p-type MOS transistor. This means that the transmission gate 506 switches whether the third potential control member 400 is electrically coupled to the other end of the ferroelectric capacitor 160 or not based on the potential of the input signal IN. In this embodiment, when the logical value of the input signal IN is the logical H, the transmission gate 506 electrically separates the third potential control member 400 from the other end of the ferroelectric capacitor 160. In contrast, when the logical value of the input signal IN is the logical L, the transmission gate 506 electrically couples the third potential control member 400 and the other end of the ferroelectric capacitor 160.

The inverter 504 inverts the logical value of the inverting input signal again and supplies it to a gate of the n-type MOS transistor 508. Either the source or the drain of the n-type MOS transistor 508 is electrically coupled to the other end of the ferroelectric capacitor 160. The other one of the source or the drain of the n-type MOS transistor 508 is electrically coupled to the gate of the n-type MOS transistor 302 and the source or the drain of the n-type MOS transistor 304.

When the logical value of the input signal IN is the logical H, a logical value of a signal supplied to the gate of the n-type MOS transistor 508 will be the logical H, and a logical value of the inverting input signal supplied to the gate of the n-type MOS transistor 304 will be the logical L. Accordingly, the n-type MOS transistor 508 becomes conductive, and the n-type MOS transistor 304 becomes non-conductive. Further, when the logical value of the input signal IN is the logical H, the transmission gate 506 also becomes non-conductive so that the gate of the n-type MOS transistor 302 is electrically coupled to the other end of the ferroelectric capacitor 160.

In contrast, when the logical value of the input signal IN is the logical L, the logical value of the signal supplied to the gate of the n-type MOS transistor 508 will be the logical L, and the logical value of the inverting input signal supplied to the gate of the n-type MOS transistor 304 will be the logical H. Accordingly, the n-type MOS transistor 508 becomes non-conductive, and the n-type MOS transistor 304 becomes conductive. Therefore, the second potential control member 300 is electrically separated from the other end of the ferroelectric capacitor 160. The gate of the n-type MOS transistor 302 is grounded which means that the gate of the n-type MOS transistor 302 is discharged.

In the delay circuit 150 of this embodiment, the capacitance coupled to the other end of the ferroelectric capacitor 160 is changed according to the logical value of the input signal IN, which is the logical H or L.

Figure 3:
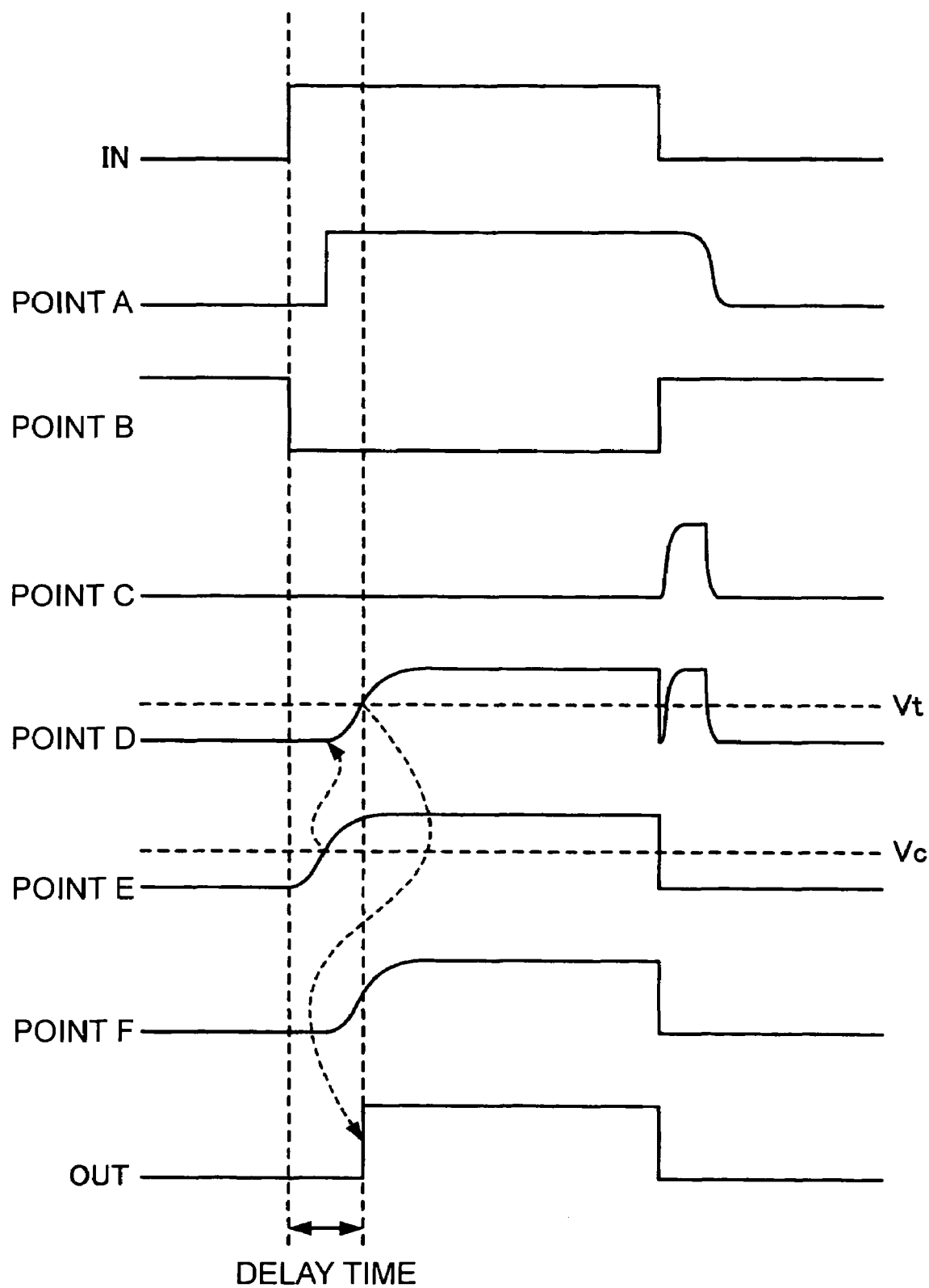
FIG. 3 is a timing diagram showing an action of the delay circuit 150.

FIG. 3 is a timing diagram showing an action of the delay circuit 150. The action of the delay circuit 150 when a pulse having a predetermined time period is inputted as the input signal IN is described, with reference to FIG. 2 and FIG. 3. As an initial state, some data is written into the ferroelectric capacitor 160 by raising the potential at the one end of the ferroelectric capacitor 160 higher than that of the other end and polarizing the ferroelectric capacitor 160.

Furthermore, in the initial state, the logical value of the input signal IN is the logical L. Accordingly, an output of the first potential control member 200 is 0 V and the electric potential at the one end of the ferroelectric capacitor 160 or the point e is also 0 V. The transmission gate 506 is conductive and the n-type MOS transistor 508 is non-conductive. Therefore, the electric potential at the other end of the ferroelectric capacitor 160 or the point d is 0 V which is the same as the output of the third potential control member 400 or the electric potential at a point c. An output signal OUT which is an output of an inverter 172 is the logical L in the initial state because the NAND circuit 170 performs logical negative multiplication between the logical value of the input signal IN and the logical value (potential) of the point d. In addition, the n-type MOS transistor 304 is conductive and the gate of the n-type MOS transistor 302 is discharged since the logical value of the input signal IN is the logical L in the initial state.

Next, when the logical value of the input signal IN changes from the logical L to the logical H, in switching member 500, the transmission gate 506 and the n-type MOS transistor 304 become non-conductive and the n-type MOS transistor 508 becomes conductive. Accordingly, the point d is electrically coupled to the gate of the n-type MOS transistor 302. In other words, the point d is in suspension and its potential remains 0 V. On the other hand, when the logical value of the input signal IN changes from the logical L to the logical H, the p-type MOS transistor 206 becomes conductive and the n-type MOS transistor 208 becomes non-conductive in the first potential control member 200. Accordingly, the electric potential at the point e gradually rises according to a resistance value of the resistive element 204. In this embodiment, the resistive element 204 is formed such that its resistance value is adjustable and a rising speed of the electric potential at the point e can be controlled by adjusting the resistance value.

After the electric potential at the point e starts rising and when a predetermined period which corresponds to the resistance value of the resistive element 204 passes, the electric potential at the point e exceeds a coercive voltage Vc of the ferroelectric capacitor 160. When the electric potential at the point e exceeds the coercive voltage Vc, the polarization of the ferroelectric capacitor 160 is inverted and the electric potential at the point d rises because of electric charges generated with the inversion. In this embodiment, the electric potential at the point d gradually rises according to the capacitance of the n-type MOS transistor 302 since the point d is electrically coupled to the gate of the n-type MOS transistor 302 which is a kind of capacitance.

When the electric potential at the point d exceeds a threshold voltage Vth of the n-type transistor and/or the p-type transistor that forms the NAND circuit 170, the output of the NAND circuit 170 changes from the logical H to the logical L. In other words, when the potential of the point d exceeds the threshold voltage Vth, a logical value of the output signal OUT changes from the logical H to the logical L. This delays a rising edge of a pulse that forms the output signal OUT by a predetermined period from a rising edge of a pulse that forms the input signal IN. Then, when the logical value of the input signal IN changes from the logical H to the logical L, the logical value of the output signal OUT becomes the logical L since the output of the NAND circuit 170 becomes the logical H.

When the logical value of the input signal IN changes from the logical H to the logical L, the p-type MOS transistor 206 becomes non-conductive and the n-type MOS transistor 208 becomes conductive in the first potential control member 200. Accordingly, the electric potential at the point e becomes 0 V. In addition, when the logical value of the input signal IN changes from the logical H to the logical L, in switching member 500, the transmission gate 506 becomes conductive and the n-type MOS transistor 508 becomes non-conductive. Accordingly, the electric potential at the point d also becomes substantially the same as that of the point e, which is 0 V. Electric charges stored in the n-type MOS transistor 302 are discharged because the n-type MOS transistor 508 becomes non-conductive and the n-type MOS transistor 304 becomes conductive.

On the other hand, after the transmission gate 506 becomes conductive, the logical value of the inverting input signal that propagates through a point b becomes the logical H and a signal that propagates through a point a is delayed against the input signal IN (and the inverting input signal). Therefore, the logical value of the point a remains the logical H for a predetermined period even after the logical value of the input signal IN changes from the logical H to the logical L. Consequently, the electric potential at the point c starts rising as soon as the logical value of the inverting input signal that propagates through the point b becomes the logical H, then reaches VCC for a predetermined period. Then, the electric potential at the point c declines and becomes 0 V as soon as a logical value of the signal that propagates through the point a becomes the logical L.

Accordingly, when the logical value of the input signal IN changes to the logical L, an electric potential difference of VCC is produced between the point e and the point d or between the two ends of the ferroelectric capacitor 160 for the predetermined period. In other words, the polarization of the ferroelectric capacitor 160 returns to the same state as the initial state since the polarization of the ferroelectric capacitor 160 is inverted again. This means that data can be written again into the ferroelectric capacitor 160.

Various changes and modifications of the examples and applications explained through the embodiments of the present invention described above are possible. The present invention is not limited to the description of the above-described embodiments and modifications may be made without departing from the scope of the present invention.

What is claimed is:

1. A delay circuit generating an output signal by delaying an input signal, comprising:
   a ferroelectric capacitor having a first end and a second end;
   an inverter inverting a polarization of the ferroelectric capacitor by producing an electric potential difference between the first end and the second end based on an electric potential of the input signal;
   a generator generating the output signal by delaying the input signal based on a change in an electric potential of the second end caused by the polarization inversion; and
   a capacitance which is electrically connectable to the second end of the ferroelectric capacitor.

2. The delay circuit according to claim 1, further comprising:
   a switch switching a coupled state of the capacitance relative to the second end of the ferroelectric capacitor based on the electric potential of the input signal.

3. The delay circuit according to claim 2, further comprising:
   a discharger discharging the capacitance in a case where the switch does not electrically couple the capacitance to the second end of the ferroelectric capacitor.

4. A delay circuit generating an output signal by delaying an input signal, comprising:
   a ferroelectric capacitor having a first end and a second end;
   an inverter inverting a polarization of the ferroelectric capacitor by producing an electric potential difference between the first end and the second end based on an electric potential of the input signal;
   a generator generating the output signal by delaying the input signal based on a change in an electric potential of the second end caused by the polarization inversion;
   a voltage source generating a predetermined voltage; and
   a resistance provided between the first end of the ferroelectric capacitor and the voltage source.

5. The delay circuit according to claim 4, wherein the resistance has an adjustable resistance value.

6. The delay circuit according to claim 4, further comprising:
   a switch switching the first end of the ferroelectric capacitor between being electrically coupled to the voltage source through the resistance and being grounded.

7. A delay circuit generating an output signal by delaying an input signal, comprising:
   a ferroelectric capacitor having a first end and a second end;
   an first inverter inverting a polarization of the ferroelectric capacitor by producing an electric potential difference between the first end and the second end based on an electric potential of the input signal;
   a generator generating the output signal by delaying the input signal based on a change in an electric potential of the second end caused by the polarization inversion; and
   a second inverter inverting the polarization of the ferroelectric capacitor again by controlling the electric potential of the second end of the ferroelectric capacitor based on an electric potential of the delay signal.

* * * * *